United States Patent [19]

Fossorier et al.

[11] Patent Number: 5,781,569
[45] Date of Patent: Jul. 14, 1998

[54] DIFFERENTIAL TRELLIS DECODING FOR CONVOLUTIONAL CODES

[75] Inventors: Marc P. C. Fossorier; Shu Lin, both of Honolulu, Hi.; Dojun Rhee, San Jose, Calif.

[73] Assignee: LSI Logic Corporation, Milpitas, Calif.

[21] Appl. No.: 738,261

[22] Filed: Oct. 28, 1996

[51] Int. Cl.[6] .................................................. H03M 13/12
[52] U.S. Cl. ................................................... 371/43.7
[58] Field of Search ................................ 371/43.6, 43.7

[56] References Cited

U.S. PATENT DOCUMENTS 5,418,795   5/1995   Itakura et al. ............................ 371/30

*Primary Examiner*—Stephen M. Baker
*Attorney, Agent, or Firm*—Kevin L. Daffer; Conley, Rose & Tayon

[57] ABSTRACT

A differential trellis decoding method for convolutional codes is provided which eliminates from candidacy half of the transitions in each round that it is used, thereby obviating the need for weight calculations for the eliminated transitions. The method is based on a decomposition of the code trellis into fully connected bipartite graphs and the observation that the symmetry of the bipartite graphs of the trellis permits the comparison and selection process for one state to influence the comparison and selection process for other states in the bipartite graph. This method results in a reduced number of operations and hence a reduced complexity for convolutional decoding.

15 Claims, 5 Drawing Sheets

DIFFERENTIAL TRELLIS DECODING FOR CONVOLUTIONAL CODES

BACKGROUND OF THE INVENTION

1. Field of the Invention

This invention relates to a method and apparatus for decoding convolutional encoded signals. Such signals are commonly used in communications and recording systems which employ error correction to combat signal corruption. The convolutional decoders discussed here are based on the Viterbi algorithm, in which weights are calculated for transitions which form survivor paths through a decoder trellis. The decoding then takes the form of tracing the most likely survivor path. More specifically, this invention concerns a novel method for determining transition weights in a convolutional decoder which when implemented leads to a significant reduction in complexity of the convolutional decoder apparatus.

2. Description of the Relevant Art

The history of error correction coding begins in 1948 with Claude Shannon. Shannon demonstrated that any communications channel has a calculable capacity such that information transmission at a rate which does not exceed the capacity can be achieved with as small an error rate as desired. This information transmission is accomplished via the use of error correction coding. Unfortunately, Shannon's proof was based on ensemble averages, and consequently did not provide a useful code construction technique. During the 1950's, an extensive amount of effort was put into developing explicit code constructions which would provide asymptotically vanishing error rates, without success. The class of Hamming codes was introduced in 1950, but these block codes were only capable of correcting single errors. Other codes were developed in the 1950's, but they were accompanied by no general construction theory. In the late 1950's, a probabilistic approach to the decoding problem led to the development of tree codes, which have been primarily represented by convolutional codes. Then around 1960, Reed-Solomon codes and the more general Bose-Chadhuri-Hocquenghem codes provided a large class of multiple error correcting codes, which comprise one of the most important classes of block codes today. However, the performance of these codes suffers when extended to large block lengths. In 1967, the invention of the Viterbi decoder provided a replacement for the sequential decoding of tree codes, thereby strengthening the feasibility of convolutional coding. Finally, in the 1970's the Justesen and Goppa code families were introduced which provided good codes with long block lengths.

Error correction codes function by accepting input data symbols and processing them in such a way as to add some redundancy to the symbol sequence. One way this is commonly done is to increase the number of symbols in the sequence, so that for every k symbols that enter the encoder, n symbols are dispatched by the encoder. The input and output symbols are generally binary digits (bits), and the information throughput is represented as a code rate of k/n.

The most popular form of error correction codes are block codes. Block codes are characterized by the feature of state-independent decoding. A block encoder can be implemented as a lookup table in which the input data word is used as an address, and the code word corresponding to the input data word is given by the contents of the table at that address. In this way a one-to-one mapping from input data words to code words is achieved. A simple decoding algorithm is to compare the received code word to all possible code words, choose the "closest" code word, and use the chosen code word as an address in a second lookup table that contains the input data word which corresponds to the chosen code word. The state-independence is a result of the one-to-one mapping that ensures each code word has only one possible interpretation. One drawback of block coding is that for adequate performance, many systems require codes with very long block lengths, necessitating large memories or more complex encoding and decoding algorithms.

As an alternate approach, short block lengths can be used, but some restrictions are added to which code words can be used. With block coding, each of the code words could be used at any time as dictated by the current input data word. This is not the case with convolutional coding, where the code words which can be used are influenced by previous input data words as well as the current input data word. This increases the effective "length" of code words by extending the range of influence of an input data word beyond one code word. As a consequence, however, there is not a one-to-one mapping from the input data words to code words, and the encoding and decoding processes are more involved.

FIG. 1 illustrates one example of a convolutional encoder. Encoder 10 includes a series of sum nodes 16 interposed between a pair of shift registers 14 and 18. Encoder 10 accepts one bit at each time step and produces three bits. Shift register 14 shifts its contents to the right one bit per time interval, accepting a new bit from the input data stream 12 in the process. Shift register 14 exemplifies a four-bit wide register which contains the current input data bit and the three previous data bits. The three previous bits are considered to form the "state of the encoder". When the shift register shifts again to the right, the current input data bit will become the most significant bit of the encoder state, thereby causing a transition to the new state. As more input data enters the shift register and the register again shifts, another transition occurs. As these transitions continue to occur, a sequence forms. This sequence of transitions between encoder states is often referred to as a path.

Associated with each transition in the path is a three bit code word that is formed based on the current input bit and the current encoder state. The contents of the shift register 14 are added together in different ways by three summers 16. The topmost summer adds the values of the first, third and fourth bits in the shift register. The middle summer adds the values of the first, second and fourth bits, and the bottom summer adds the values of all four bits. In each case, the summation is done modulo two, so that the output of the summer is one if the result is odd, and zero if the result is even. The summer outputs are passed to the shift register 18 to form the output code word. Shift register 18 then shifts three times to pass its contents to the output line 20 before the next input bit is accepted. The rate of this encoder is thus $\frac{1}{3}$. The number of encoder states is $2^3=8$ since three previous input bits are held in shift register 14.

In summary, convolutional encoder 10 accepts one input S bit ($I_1$) per time step and calculates a three bit code word based on the input bit and the encoder state, wherein the encoder state shown comprises the past three input bits ($B_1$, $B_2$ and $B_3$). The sequence of code words passes through a transmission channel which is typically subject to interference that may corrupt the sequence of code words. To decode the code word sequence, a decoder will attempt to reverse the encode process and decide what the input bit is, based on the code word and state of the encoder. However, the decoder does not know for certain what the state of the encoder is, so the decoder often maintains a decision unit for each possible encoder state, and the decoding decision will be based on the most likely encoder state as determined by the sequence of code words.

To decode the code word sequence, a time-expanded version of the encoder state transition diagram is formed. FIG. 2 shows one stage of the resulting decoder trellis. The eight states the encoder could be in at a given time t are listed on the left in FIG. 2, and the eight states the encoder could be in at time t+1 are listed on the right. The lines in FIG. 2 represent the possible state transitions. For example, if at time t the encoder is in state 000 and the current input bit is 1, at time t+1 the encoder will be in state 100. The only other possible transition from state 000 at time t occurs when the current input bit is 0, which results in a transition to state 000 at time t+1. For all states shown, the uppermost branch illustrates a state transition resulting from a current input bit of 0, and the lower branch illustrates a state transition resulting from a current input bit of 1. This trellis thereby duplicates the effects of shift register 14 which produces a state transition by shifting the current input bit into the most significant bit position of the encoder state.

Also shown in FIG. 2 are the code words that correspond to each transition. The code words are those produced by encoder 10 based on the current input bit and the encoder state. The encoder state transition from 000 at time t to 000 at time t+1 corresponds to an output code word of 000. This correspondence was determined from FIG. 1 where it can be seen that when $I_1$, $B_1$, $B_2$, and $B_3$ are zero, the summers 16 all produce a zero output, causing $C_1$, $C_2$ and $C_3$ to be zero. Similarly, the encoder state transition from 000 at time t to 100 at time t+1 corresponds to an output code word of 111. This time when using FIG. 1, $I_1$ equals one, while $B_1$, $B_2$, and $B_3$ are zero, resulting in summers 16 all producing an output of one, causing $C_1$, $C_2$ and $C_3$ to be one.

FIG. 2b shows a time expansion of the decoder trellis. At each time step the decision units contain the weight of the most likely path to that state. The most likely path to each possible state node is found by starting at the node in question and tracing backward along the chosen transitions which are drawn with the thick lines. If no more code words are received, the decoding may be performed by choosing the node at time t=6 with the smallest weight as the most likely encoder state and following the most likely path to that state from left to right. An input bit of 0 is decoded if the path follows the top transition from a node, and a 1 is decoded if the path follows the bottom transition from a node. In FIG. 2b the decoded data as indicated by the trail of thickest lines found by tracing backward from state 000 at time t=6 is 0 1 0 0 0 0. Details on the calculation of the weights and selection of the transitions follow.

The decoder is initialized by setting the weight of the first node at time t=0 to zero and the rest of the node weights to a large number. This is done because it has been decided ahead of time that the initial state of the encoder is 000. Thereafter as code words come in at each time step, a metric (defined here to be a measure of difference between two signals) is formed for each code word which effectively measures the distance from the signal received at that time step to the code word. Classically, the metric used is the squared Euclidean distance. As an example, assume that at time t=0 the received signal is 100. Then the metrics M for each of the eight possible code words are $(c_1-1)^2+(c_2-0)^2+(c_3-0)^2$ which yields the following results:

$M'_{000}=1$ $M'_{001}=2$ $M'_{010}=2$ $M'_{011}=3$
$M'_{100}=0$ $M'_{101}=1$ $M'_{110}=1$ $M'_{111}=2$ where $M'_c$ equals the metric at time t for code word c.

Each encoder state node at time t>0 has associated with it a weight and a path. The path is the most likely sequence of transitions that would have been taken by the encoder if indeed it is in that state. Recall that at a given time the encoder has only one state, but the decoder maintains a decision unit for all possible encoder states. The decision units each track the weight of one state, and their decisions are passed to a memory unit which tracks the corresponding paths.

The weight associated with each state node is defined as the sum of the metrics formed by the most likely path to that node. In the decoder trellis shown in FIG. 2b, each of the paths to the nodes at time t will have two possible extensions formed by the two transitions from each possible encoder state. The weight of each node at time t+1 is found by choosing the minimum weight of the two incoming transitions, where the weight of a transition is defined as the sum of the weight of the node it originates from and the metric of the code word that corresponds to that transition. The new path for the node at time t+1 is then the path to the originating node (at time t) that was chosen plus the transition.

For simplicity in the previous example, the received signal was assumed to be a sequence of integer values. It should be noted that the Euclidean distance metric used allows the use of quantized real values, and in general the latter is the preferred implementation.

The aforesaid decoding method was conceived by A. J. Viterbi who realized that any paths which merged to a common encoder state would have the same possible extensions and hence would not possess any distinguishing characteristics beyond that point. Therefore, making a decision at the merge point does not cause any loss of optimality, but will significantly reduce the decoding complexity since only a constant number of paths needed to be kept in memory. Even so, the decoding algorithm outlined above still possesses significant complexity in that each branch of the decoder trellis requires the calculation of a weight value, and a comparison and selection process must be performed to determine the transition with the minimum weight.

As an exercise to illustrate the complexity of the decoder, consider the steps taken by the decoder to update the node weights after a code word is received. First, a metric is calculated for each of the possible code words. For this example that translates into three additions, three squarings, and two more additions for each of eight code words yields 40 additions and 24 multiplications. Second, a weight is calculated for each branch in the trellis diagram. For this simple example there are 16 edges, necessitating 16 additions. Third, for each node all the weights of the incoming branches must be compared to determine the smallest. The two branches per node in this example need only 1 comparison, yielding a total of 8. In total, 56 additions, 24 multiplications, and 8 comparisons are needed per time step. One technique for reducing the number of operations which perform the metric calculation described in the first step will be outlined hereinafter. One of the major concerns which remains to developers is the number of operations needed for the second and third steps. The number of branches in convolutional codes is an exponential function.

In the example provided, each state has two incoming branches, so only one comparison and selection is necessary to determine the transition with the minimum weight. In the general case, the number of branches entering a state is $2^r$, which requires r rounds of comparison and selection. In each round of the compare and select process, the branches are grouped into pairs and compared. Of the two, the branch with the smaller weight is "selected", which means only that the other branch is dropped from candidacy as the minimum weight branch. Consequently in each round, half of the branches are dropped from candidacy, and after r rounds, only the minimum weight branch remains. The minimum weight branch for a state is referred to as a "survivor", the weight associated with the survivor is referred to as the survivor weight, and the path associated with the survivor is referred to as the survivor path.

Comparison and selection process must be performed for all states and for every code word received. Computational overhead for a Viterbi decoder can therefore be substantial.

SUMMARY OF THE INVENTION

The problems outlined above are in large part solved by a differential trellis decoding algorithm which eliminates from candidacy half of the transitions in each round that it is used, and does so prior to the calculations of the transition weights, thereby obviating the need for weight calculations for the eliminated transitions. This results in a reduced number of operations and hence a reduced complexity for convolutional decoding.

Broadly speaking, the present invention contemplates a digital communications system comprising a convolutional encoder, a discrete-time channel, and a convolutional decoder. The convolutional encoder serves to convert a digital signal to an encoded digital signal containing a sequence of code words. The encoded digital signal may then be transmitted through a transmission channel or written to a storage medium and read therefrom. These actions are represented in the form of the discrete-time channel. The encoded and possibly corrupted signal output from the discrete-time channel is received by a convolutional decoder comprising a circuit for survivor weight determination and a memory for storing and updating survivor paths. Survivor weight determination involves a module which performs a differential trellis decoding operation to eliminate transitions from candidacy and thereby reduce the number of operations necessary for decoding.

The present invention further contemplates an apparatus for convolutional decoding a possibly corrupted encoded signal. The apparatus can determine survivor weights and thereafter store and update survivor sequences. The apparatus includes a module which performs a differential trellis decoding operation to eliminate transitions from candidacy and thereby reduce the number of operations necessary for decoding.

The present invention yet further contemplates a method for reducing the number of operations required to perform convolutional decoding. This method includes a computational step which eliminates half of the transitions from candidacy without first calculating the weights for the transitions and thereby obviates the need for calculating weights of the eliminated transitions.

BRIEF DESCRIPTION OF THE DRAWINGS

Other objects and advantages of the invention will become apparent upon reading the following detailed description and upon reference to the accompanying drawings in which.

Figure 1:
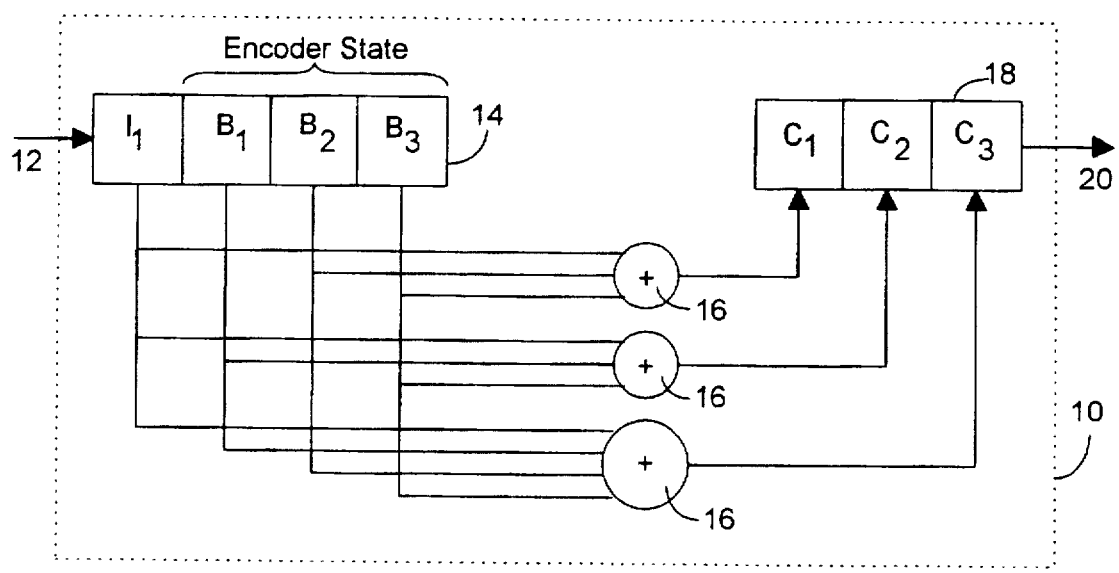
FIG. 1 is a functional schematic diagram of an eight state, rate ⅓ convolutional encoder.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
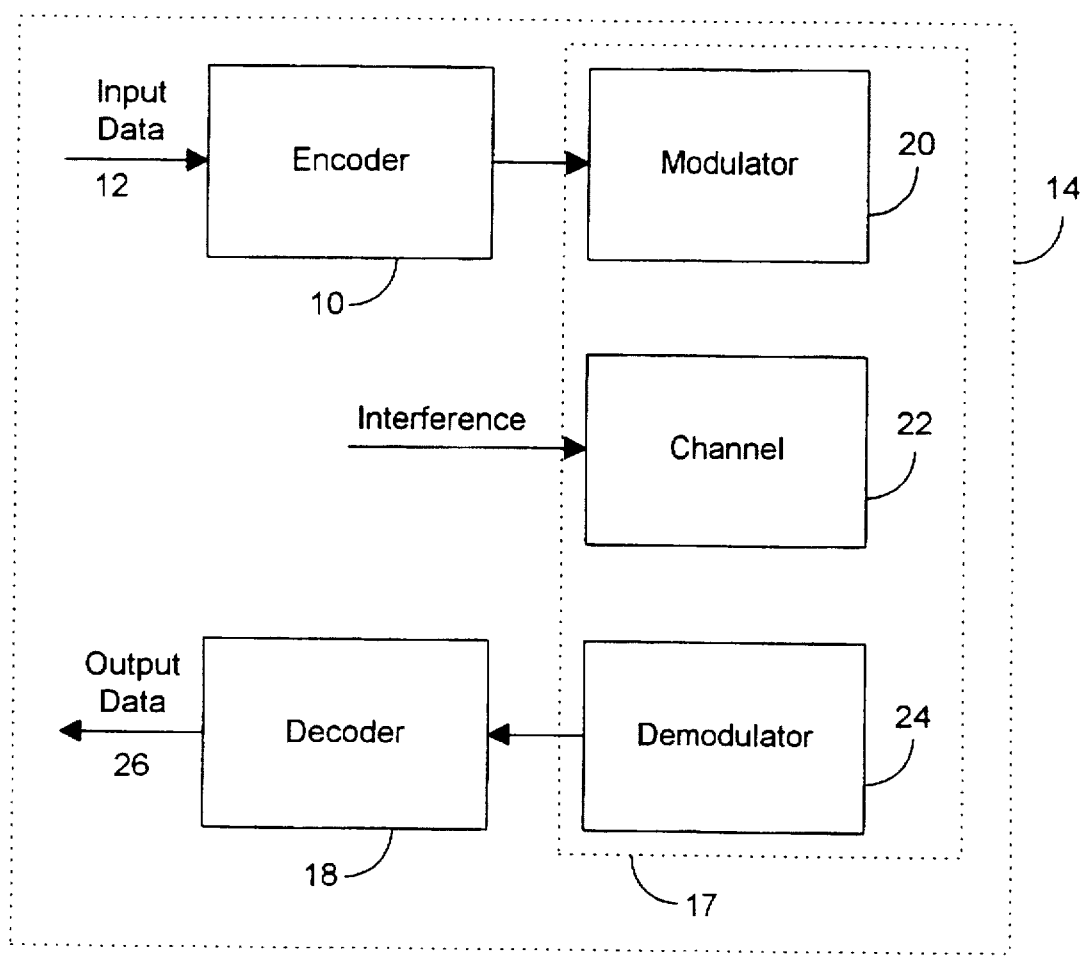
FIG. 3 is a block diagram of a digital communications system having a convolutional encoder and decoder capable of error correction.

Turning now to the drawings, FIG. 3 represents a digital communications system 14 comprising a discrete-time channel 17 interposed between a convolutional encoder 10 and a convolutional decoder 18. Discrete-time channel 17 comprises a modulator 20, a channel 22, and a demodulator 24. Channel 22 may be a transmission channel or a storage medium being written to and read from. Modulator 20 serves to translate a digital output signal from encoder 10 into signals suitable for channel 22, and thereafter drives said signals across channel 22. Channel 22 may suffer from interference that corrupts said signals, the interference possibly taking form in any combination of additive noise, cross channel interference, multi-path interference, and channel fading. Demodulator 24 comprises the serves to receive said signals from channel 22 while minimizing the interference as much as is practical, and thereafter translate said signals into digital signals for input to decoder 18. Discrete-time channel 17 can thus be viewed as a unit accepting digital input signals and producing possibly corrupted digital output signals.

Figure 4:
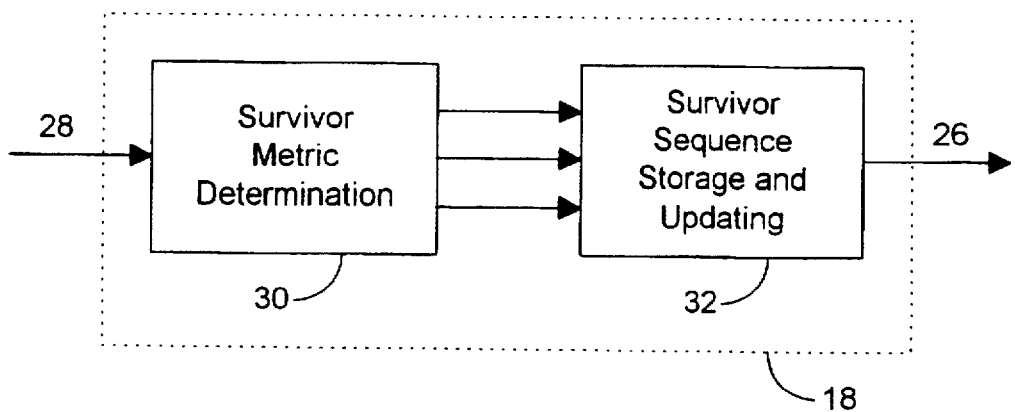
FIG. 4 is a block diagram of a convolutional decoder.

Encoder 10 is a convolutional encoder which serves to add redundancy to input data signal 12. The added redundancy allows for detection and correction of errors that may result from corruption of signals passing across discrete-time channel 17. The error detection and correction is performed by convolutional decoder 18. As shown in FIG. 4, convolutional decoder 18 comprises a circuit subsystem 30 which can determine survivor weights and a memory 32 for survivor path storage and updating. Survivor path storage and updating memory 32 serves to track the most likely path to each decoder node based on output from survivor weight determination circuit 30. Several methods for rendering decoded output exist, many of which are in open literature and may be used in the present invention. One such method is to limit the maximum path lengths in the survivor path storage and updating memory 32, and to avoid exceeding the maximum length, decoding decisions are made based on the most likely path at the time. Thereafter, the portions of the path sequences up to and including the locations of the decoding decisions can be dropped.

Survivor weight determination circuit 30 is typically implemented using an add-compare-select (ACS) approach.

Several variations on this approach exist, mostly concerning the metric calculation method. One popular approach is outlined here, in the interest of better illustrating the improvements allowed by the current invention.

In this approach, the distance between the received signal and each of the possible code words is first calculated. The distance used is typically the squared Euclidean distance. The formula is $$M_c = (y-c)(y-c)^T,$$

where y represents the received signal, c is the code word, and T is the transpose operator. In general y and c are row vectors and this equation is an inner product which yields a scalar value: the sum of the squares of the components of the difference vector. Investigating this relationship more closely it can be determined that no squaring is necessary to calculate useful metrics:

$$M_c = SUM_{i=1,n}\{y_i^2 - 2c_iy_i + c_i^2\}$$

$$M_c = SUM_{i=1,n}\{y_i^2\} + SUM_{i=1,n}\{-2c_iy_i\} + SUM_{i=1,n}\{c_i^2\}$$

The first term in this equation is common to all the metrics. Since the object is to find the minimum weight, subtraction of common value from all metrics will not affect the outcome. Therefore, the first term can be dropped. In reference to the last term, the components $c_i$ of the code word are 0 and 1, hence squaring them has no effect. The metric equation now reads:

$$M_c = SUM_{i=1,n}\{c_i(1-2y_i)\}$$

and is easily performed by passing the decoder input 26 through a gain and dc-offset circuit, gating the output based on whether $c_i$ is 0 or 1, and summing the components using a resistor network.

Figure 5:
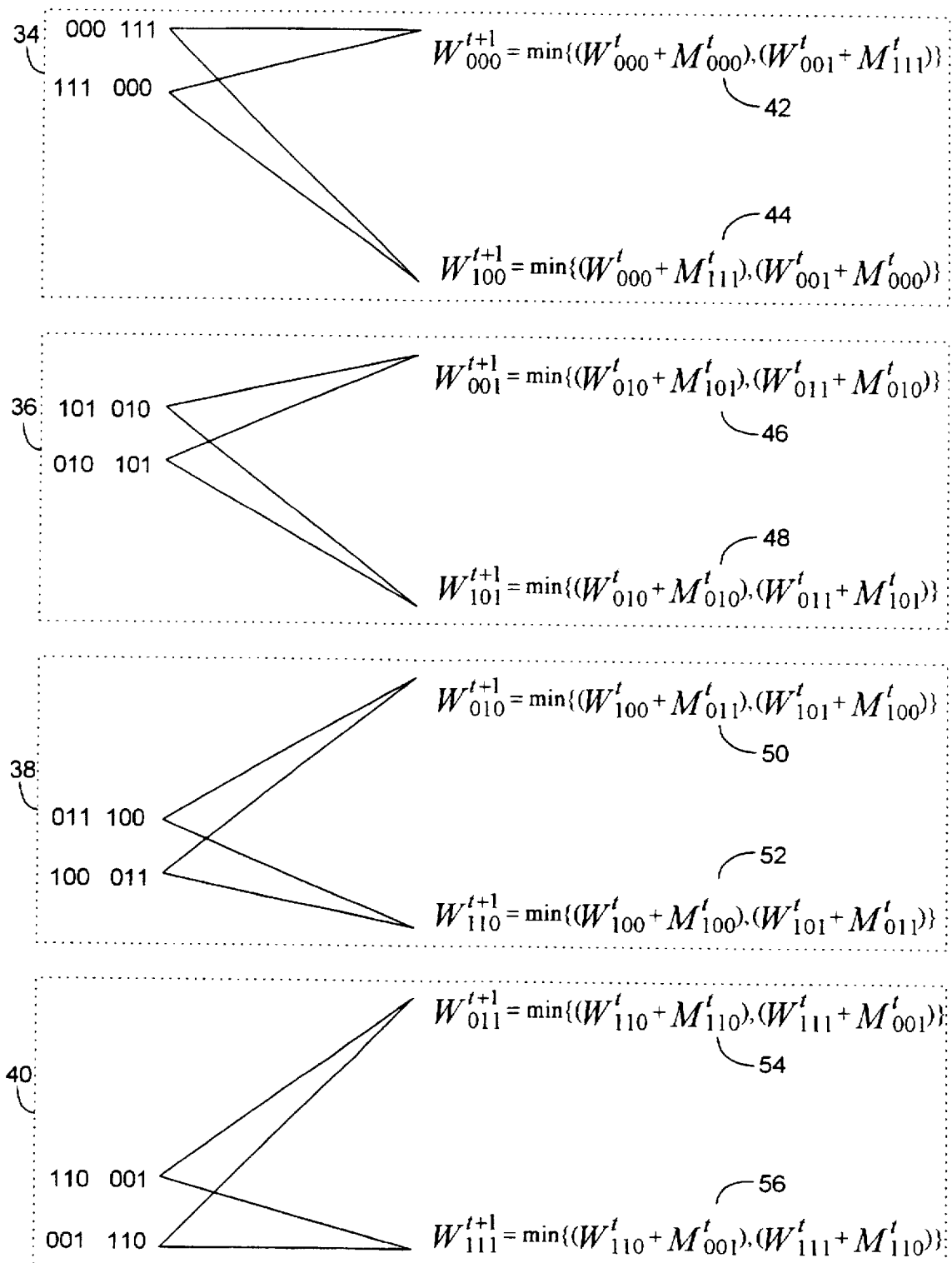
FIG. 5 is a decomposition of a trellis diagram into fully connected bipartite graphs.

As mentioned in the background section, the weight of each transition is the sum of the weight of the node it originates from and the metric of the code word that corresponds to that transition. This is the next step in the ACS approach. The weight of each node at time t+1 is found by choosing the minimum weight of the incoming transitions. The expressions 42–56 in FIG. 5 are used to evaluate the weight of the nodes at time t+1. For example, equation 46, repeated below, is evaluated in the following manner: the weight of state 001 at time t+1 is the minimum of either (1) the weight of state 010 at time t plus the metric for code word 101, or (2) the weight of state 011 at time t plus the metric for code word 010.

$$W^{t+1}{}_{001} = min\{(W'{}_{010} + M'{}_{101}), (W'{}_{011} + M'{}_{010})\}$$

For the present example, each state has only two incoming transitions (i.e., for every node at time t+1 there are two incoming transitions from two nodes at time t), but in general the number of incoming transitions may be a larger power of two. A larger number of incoming transitions has the effect of necessitating additional comparisons to eliminate candidates for the minimum weight transition. For each state at time t+1, a signal representing which transition is selected is passed to the survivor path storage and updating (SPSU) module 32.

One important variation on the popular approach outlined above is used for a correlation-based Viterbi decoder. The classic Viterbi decoder discussed in the background section operates on the principle of minimizing the distance between the chosen sequence and the received signal. The correlation-based Viterbi decoder operates on the principle of maximizing the correlation between the chosen sequence and the received signal. The correlation is defined to be the integral of the product of the received signal and the expected signal. For binary phase-shift keying (BPSK), the correlation value is conveniently provided through use of a matched filter demodulator. Let $y_i$ be an output sample of the matched filter demodulator. The correlation metric is then plus or minus $y_i$, depending on whether a 1 or 0 is expected. For example, the correlation metric for the codeword 010 is $-y_1 + y_2 - y_3$. Stated as a formula, the correlation metric is $$M_c = SUM_{i=1,n}\{(2c_i - 1)y_i\}.$$

Recall that when the correlation metric is used, the goal is to maximize, not minimize, the selected path weights.

At least two methods exist for implementing the SPSU module: the trace back method and the register exchange method. The trace back method uses an array of memory elements in which the rows correspond to states and the columns correspond to time indexes similar to the arrangement in FIG. 2b. The contents of the memory elements of a given column point to the previous column state from which the chosen transition originated. In effect this produces a network of lines like the thick lines shown in FIG. 2b. The decoding takes place at each time step by tracing back through the array.

Figure 2:
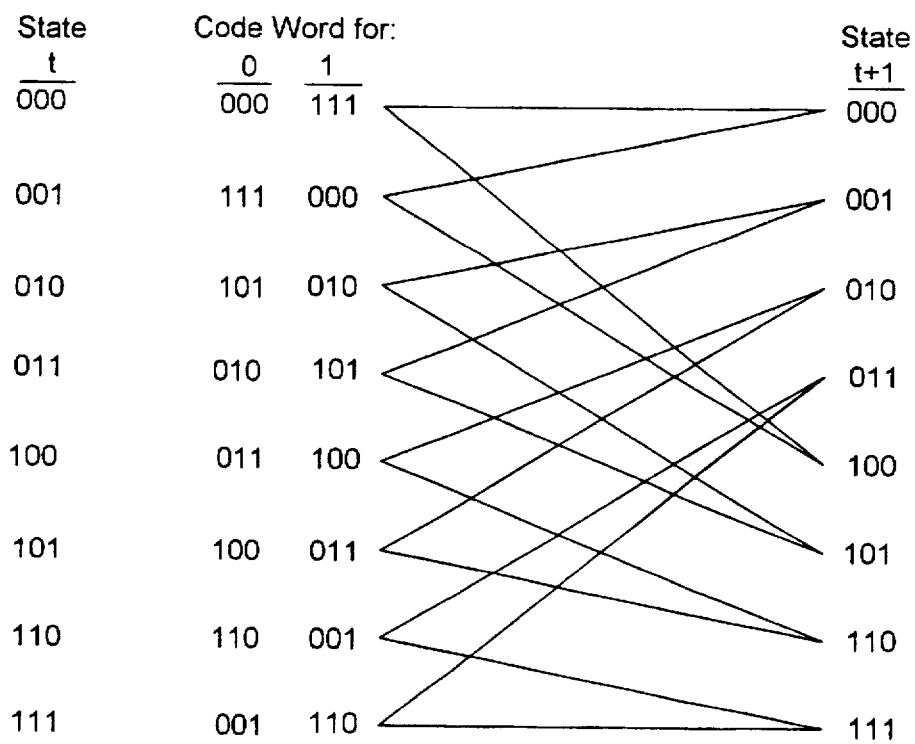
FIG. 2 is one stage of the trellis diagram of the eight state, rate ⅓ convolutional code implemented by the encoder of FIG. 1.
Figure 2B:
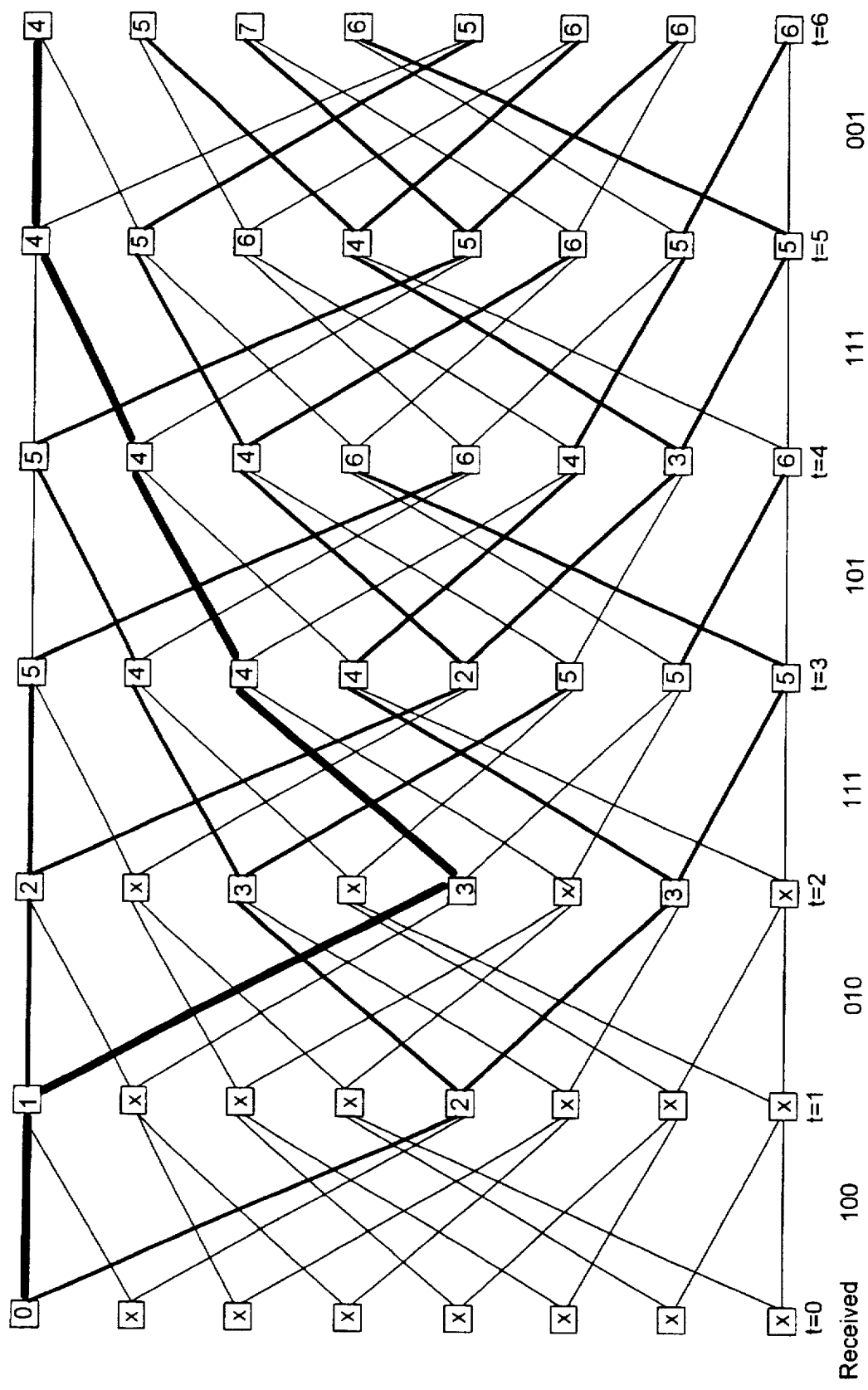
FIG. 2b is an expanded trellis diagram of the eight state, rate ⅓ convolutional code illustrating the algorithm whereby weights are assigned to possible encoder states in the decoding of a received code word sequence.
Figure 6:
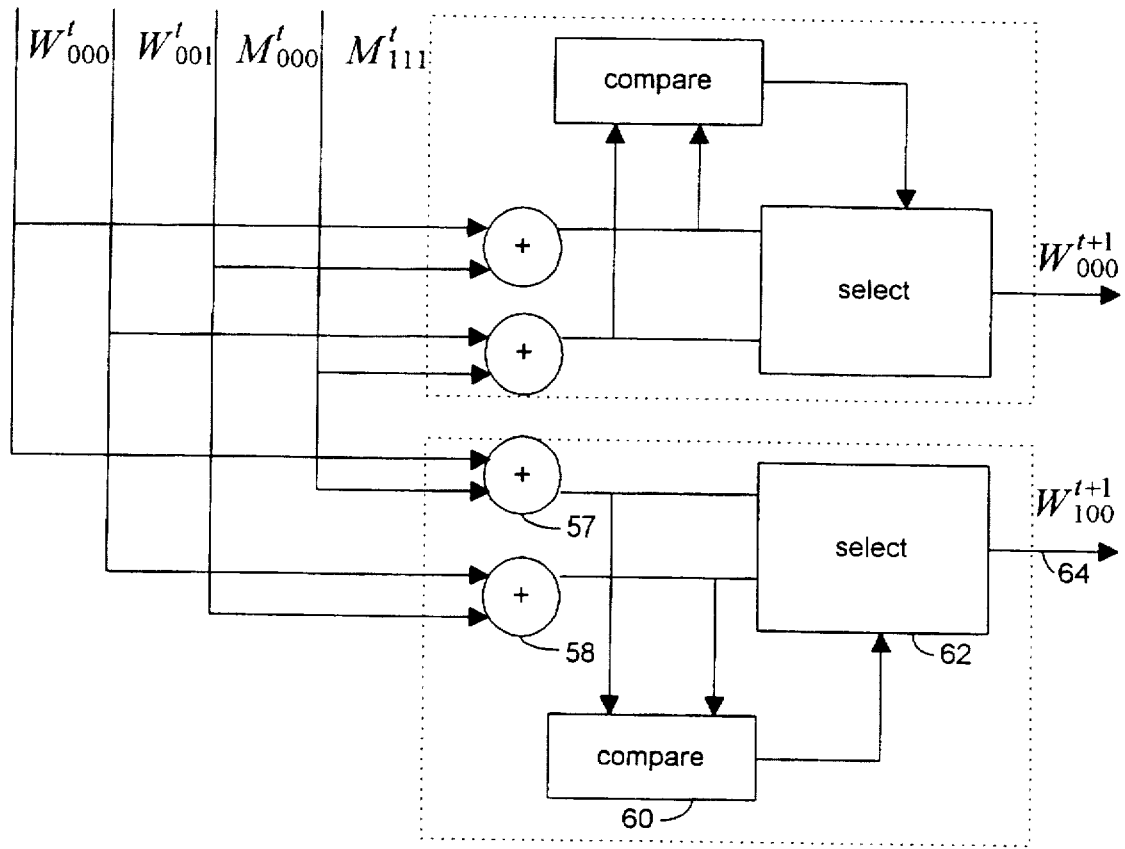
FIG. 6 is a functional schematic of a circuit for survivor metric determination by established techniques.

A convolutional code trellis such as that shown in FIG. 2 can always be decomposed into one or more fully connected bipartite graphs (i.e. graphs which can be divided into two sets of nodes such that each of the nodes in one set are connected to all of the nodes in the other set). The decomposition for the trellis shown in FIG. 2 is shown in FIG. 5. For the ACS approach, this decomposition is unnecessary, but will not affect the algorithm complexity. With this decomposition, each expression evaluation for the fully connected bipartite graphs 34–40 can be performed with an ACS unit for each state. The ACS computational units for fully connected bipartite graph 34 are shown in FIG. 6.

The ACS units are a straightforward evaluation of expressions 42 and 44. Adders 57 and 58 add a code word metric to a state weight, the outputs of the adders are compared by comparators 60 which determines the minimum, and sends a signal to the steering logic 62 which selects the correct weight for output line 64. These actions are the add, compare and select that give rise to the name of the ACS approach.

The present differential trellis decoding invention makes use of the fact that the states and metrics in a fully connected bipartite graph are not independent. In particular, the differences in weight between states at time t from which the transitions diverge, are the same for the states at time t+1. In addition, the differences between code word metrics for incoming edges are symmetric for the states at time t+1. As a result, it is possible to devise a substitute mechanism for the ACS units which will require a smaller number of operations.

Continuing with the example of the fully connected bipartite graph 34 shown in FIG. 5, the differential trellis decoding can be explained as shown below. The decision of which transitions survive is based on the comparisons:

$$(W'{}_{000} + M'{}_{000}) \leq (W'{}_{001} + M'{}_{111}) \text{ and } (W'{}_{000} + M'{}_{111}) \leq (W'{}_{001} + M'{}_{000}).$$

For the comparisons which are true, the upper incoming transition to that node is chosen. For the comparisons which are false, the lower incoming transition to that node is chosen. By rewriting these comparisons to be:

$$(W'_{000}-W'_{001}) \leq (M'_{111}-M'_{000}) \text{ and } (W'_{000}-W'_{001}) \leq -(M'_{111}-M'_{000}),$$

it can be determined that the four possible combinations of results of these two comparisons can be determined by the sign of the difference with the larger magnitude. For both comparisons to be true, the magnitude of the weight difference must be larger, and the weight difference must be negative. For both comparisons to be false, the magnitude of the weight difference must be larger, and the weight difference must be positive. For the first comparison to be true and the second false, the magnitude of the metric difference must be larger, and the metric difference must be positive. For the first comparison to be false and the second true, the magnitude of the metric difference must larger, and the metric difference must be negative.

Figure 7:
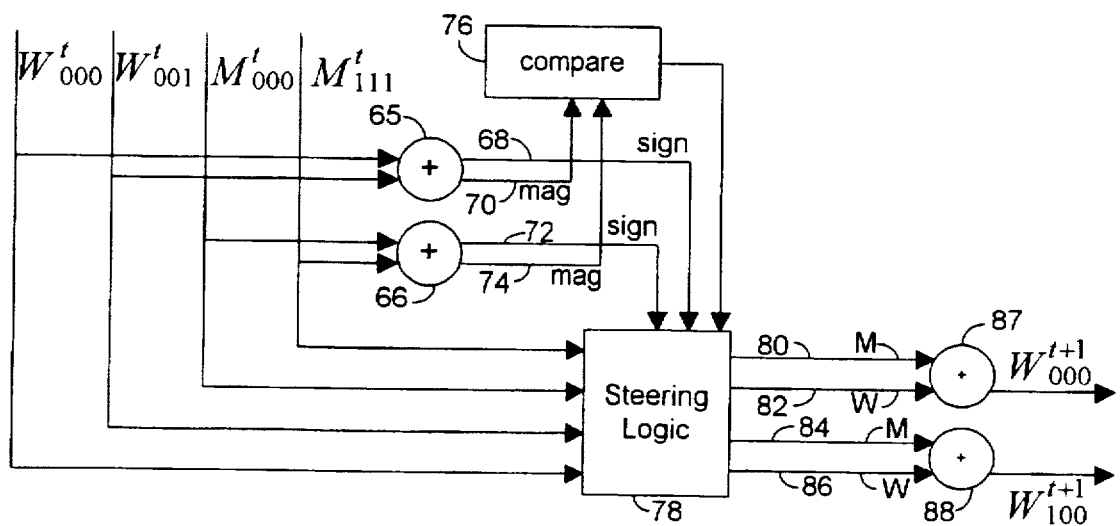
FIG. 7 is a functional schematic of a circuit for survivor metric determination according to the present invention.

A substitute differential trellis decoding (DTD) mechanism for the ACS units shown in FIG. 6 is illustrated in FIG. 7. Adder 65 takes the difference of the state weights at time t and produces the sign of the difference 68 and the magnitude of the difference 70. Adder 66 takes the difference of the metrics and produces the sign of the difference 72 and the magnitude of the difference 74. Comparator 76 compares the magnitudes of the differences 70 and 74, and produces a signal indicative of which is larger. This signal along with the signs of the differences 68 and 72 are input to steering logic 78 which determines which weights (82 and 86) and metrics (80 and 84) will be used to calculate the weights of the states at time t+1. Each of the adders 87 and 88 receives a state weight of a previous state (i.e., a node at time t) and a code word metric, both of which correspond to the previous-state-to-current-state transition with the minimum weight. The output of the adders will be the weight of the states at time t+1.

Note that adder 66 is shown for generality, but typically will not be necessary. For example, when correlation metrics are used, the difference between metrics is simply twice one of the metrics. Recall that the metric for codeword 010 is $M_{010}=-y_1+y_2-y_3$. The other codeword in the butterfly is 101 with a metric $M_{101}=y_1-y_2+y_3=-M_{010}$. Thus $M_{010}-M_{101}=2M_{010}$. Consequently adder 66 can be replaced by a multiplier that scales the metrics by 2. Multiplication by 2 is a trivial operation in logic design, and it can be performed independently as soon as the metrics have been computed. Therefore, the number of operations required to determine the state weights at time t+1 for the fully connected bipartite graph 34 has been reduced from six to four.

If each state has more than two incoming transitions then additional comparisons are necessary. The preferred method for the additional comparisons is the ACS approach. The differential trellis decoding method is used only in the first round of comparisons. The decoding method may be used in later comparison stages, but the reduction in the number of operations must be paid for in terms of added delay. A difference operation must be performed after each comparison stage to determine the difference between the weights of the states at time t which have not been eliminated.

In summary to what has been presented above, a convolutional decoder has been described which determines node weights from previous node weights and code word metrics in a novel fashion. By comparing magnitudes of the differences between previous node weights with the magnitudes of the differences between metrics, a decision can be made on which transitions will survive, before the actual calculation of transition weights is performed. After the decision is made, then the calculation of the transition weights is performed only for the survivors, thereby reducing the overall number of operations performed in the calculation of node weights. The node weights calculated by choosing the minimum incoming transition weight (found by adding a code word metric to a previous node weight) correspond to probabilities for the "survivor" paths that reach the nodes. By maintaining a record of a survivor path for each node (i.e. the most likely sequence of transitions to reach that node), the overall decision as to which path constitutes "the correct" path through the decoder trellis can be postponed until some criterion is met. One possible criterion is encountering the end of the input data sequence. At this time, a decision is made by choosing the current node with the smallest weight. The "correct" (i.e. most likely) path may be found by "tracing back" through the trellis. This path can then be decoded from left to right according to the stipulation that taking the uppermost transition leaving a state corresponds to a decoded zero, and that taking the lowermost transition leaving a state yields a decoded one.

It is understood that the discussed DTD apparatus applies to hard decision demodulated (integer) received signals as well as to soft decision demodulated (quantized real valued) received signals. Furthermore, it is to be noted that the DTD apparatus can be modified to accept correlation metrics and to select the weights and metrics corresponding to the maximum path metric rather than the minimum path metrics. This modification takes the form of a minor alteration in steering logic 78.

Numerous variations and modifications will become apparent to those skilled in the art once the above disclosure is fully appreciated. It is intended that the following claims be interpreted to embrace all such variations and modifications.

What is claimed is:

1. A digital communications system comprising:
   a convolutional encoder comprising:
      a shift register configured to receive a current input word and store a number of previous input words within a sequence of input words, said number of previous input words establishing a current encoder state from a plurality of possible current encoder states, and said current input word and said current encoder state establishing a transition from a plurality of possible transitions to a subsequent encoder state; and
      a plurality of summers configured to add bits from said current input word and said current encoder state, thereby producing a code word associated with said transition, said code word being one of a plurality of code words having a correspondence with said plurality of possible transitions;
   a discrete-time channel configured to receive said one of the plurality of code words;
   a convolutional decoder coupled to receive a digital signal from said discrete-time channel during a time interval in which said one of the plurality of code words is configured for transmission, and thereafter compare said digital signal to said plurality of code words to determine a plurality of metrics having a correspondence with said plurality of possible transitions, said convolutional decoder comprises:
      a memory media configured to store a plurality of weighting factors associated with said plurality of possible current encoder states; and
      an execution unit coupled to said memory media to determine a first difference between two of the plurality of weighting factors, to determine a second difference between two of the plurality of metrics, and thereafter compare said first difference and said second difference to determine a weighting factor and a surviving transition for said subsequent encoder state.

2. The digital communications system as recited in claim 1, wherein one of said two of the plurality of weighting factors is discarded if it, in additive combination with one of the two of said plurality of metrics, is greater than the other of the weighting factors combined with the other of the metrics.

3. The digital communications system as recited in claim 1, wherein one of said two of the plurality of weighting factors is discarded if it, in additive combination with one of the two of said plurality of metrics, is less than the other of the weighting factors combined with the other of the metrics.

4. The digital communications system as recited in claim 1, wherein said surviving transition forms a portion of a survivor path if it is not discarded, and wherein said survivor path is stored within said memory media.

5. The digital communications system as recited in claim 1, wherein said execution unit comprises logic coupled to determine a survivor path by comparing minimum weighting factors associated with said plurality of possible current encoder states cumulated with respective metrics from said plurality of metrics, and thereby correct, based on said survivor path, errors imputed upon the encoded digital signal by said discrete-time channel.

6. A convolutional decoder apparatus coupled to receive a digital signal from a discrete-time channel during a time interval in which one of a plurality of code words is configured for transmission, and thereafter compare said digital signal to said plurality of code words to determine a plurality of metrics having a correspondence with a plurality of possible transitions, said convolutional decoder comprises:

a memory media configured to store a plurality of weighting factors associated with a plurality of possible current encoder states; and an execution unit coupled to said memory media to determine a first difference between two of the plurality of weighting factors, to determine a second difference between two of the plurality of metrics, and thereafter compare said first difference and said second difference to determine a weighting factor and a surviving transition for said subsequent encoder state.

7. A convolutional decoder apparatus as recited in claim 6, wherein one of said two of the plurality of weighting factors is discarded if it, in additive combination with one of the two of said plurality of metrics, is greater than the other of the weighting factors combined with the other of the metrics.

8. A convolutional decoder apparatus as recited in claim 6, wherein one of said two of the plurality of weighting factors is discarded if it, in additive combination with one of the two of said plurality of metrics, is less than the other of the weighting factors combined with the other of the metrics.

9. A convolutional decoder apparatus as recited in claim 6, wherein said surviving transition forms a portion of a survivor path if it is not discarded, and wherein said survivor path is stored within said memory media.

10. A convolutional decoder apparatus as recited in claim 6, wherein said execution unit comprises logic coupled to determine a survivor path by comparing minimum weighting factors associated with said plurality of possible current encoder states cumulated with respective metrics from said plurality of metrics, and thereby correct, based on said survivor path, errors imputed upon the encoded digital signal by said discrete-time channel.

11. A method for error correcting a digital signal, comprising:

encoding a digital signal to one of at least two code words, each of said code words corresponding to a transition from two possible first encoder states to a single, second encoder state, wherein the second encoder state occurs subsequent to said first encoder states, and wherein said first encoder states form a part of respective survivor paths of a sequence of transitions between encoder states;

forwarding said code words across a discrete-time channel which is susceptible to imputed noise;

determining a first difference between a pair of metrics associated with said two code words;

determining a second difference between a pair of weighting factors associated with said two possible first encoder states;

comparing said first difference to said second difference to ascertain which two of four possible combinations of one of said pair of metrics and one of said pair of weighting factors are associated with transitions which may extend said respective survivor paths; and error correcting said imputed noise from the encoded digital signal by constructing a most likely survivor path and making one or more decoding decisions based thereon.

12. A method for error correcting a digital signal as recited in claim 11 wherein a plurality of survivor paths, which includes said respective survivor paths, with a one-to-one correspondence to a plurality of possible encoder states is maintained, said correspondence taking the form of each possible encoder state having one survivor path which is a path which ends in said possible encoder state with a transition that has a minimum weighting factor.

13. A method for error correcting a digital signal as recited in claim 11 wherein said plurality is iteratively determined by extending a plurality of candidate paths from said plurality of survivor paths, determining a weighting factor for each transition which extends said plurality of survivor paths, and eliminating all but one of said plurality of candidate paths for each of said plurality of possible encoder states.

14. A method for error correcting a digital signal as recited in claim 12 wherein said most likely survivor path is determined from said plurality of survivor paths by choosing a survivor path that ends in a transition with a smallest minimum weighting factor.

15. A method for error correcting a digital signal as recited in claim 11 wherein said one or more decoding decisions are made by determining which encoder inputs would initiate state transitions which comprise the most likely survivor path.

* * * * *